United States Patent [19]

Davies, Jr.

[11] 4,104,538

[45] Aug. 1, 1978

[54] DIGITALLY SYNTHESIZED BACK-UP FREQUENCY

[75] Inventor: Thomas J. Davies, Jr., San Jose, Calif.

[73] Assignee: Fairchild Camera and Instrument Corporation, Mountain View, Calif.

[21] Appl. No.: 792,155

[22] Filed: Apr. 29, 1977

[51] Int. Cl.² .............................................. H02J 9/00
[52] U.S. Cl. ....................................... 307/64; 307/66; 307/129; 307/106
[58] Field of Search ................... 307/64, 66, 129, 106; 361/182, 184; 235/92 FQ; 340/253 Y

[56] References Cited

U.S. PATENT DOCUMENTS

| | | | |
|---|---|---|---|
| 3,229,111 | 1/1966 | Schumacher et al. | 307/66 |
| 3,529,215 | 9/1970 | Xavier et al. | 307/129 |
| 3,558,911 | 1/1971 | Chen | 307/129 |
| 3,805,139 | 4/1974 | Hoffman, Jr. et al. | 307/66 |

Primary Examiner—Robert K. Shaefer
Assistant Examiner—Eugene S. Indyk
Attorney, Agent, or Firm—Alan H. MacPherson; Robert C. Colwell

[57] ABSTRACT

A digitally synthesized frequency back-up circuit which, after removal or failure of applied A.C. power, will reproduce signals precisely indicative of each zero transition point of the A.C. waveform. A high frequency binary counter continually counts internally generated pulses and at the end of each A.C. period, stores one-half the count, representing 180°, in a storage buffer. When the A.C. fails, the inverted value of the buffer count is loaded into the counter which is incremented by the internally generated pulses to count only up to the value stored in the buffer, at which point the circuit generates an output pulse. As long as the A.C. frequency remains off, the counter will continue to reload from the buffer and count the value representing this 180° period. An additional and separate buffer section in the circuit stores the binary count representing the 90° point in each A.C. cycle and continuously generates 90° output signals that may be used to control switches for transient-free operation of associated electrical devices.

11 Claims, 3 Drawing Figures

DIGITALLY SYNTHESIZED BACK-UP FREQUENCY

CROSS-REFERENCE TO RELATED APPLICATION

This application is related to application Ser. No. 792,617, filed May 2, 1977, for "INCREMENTER/DECREMENTER," now U.S. Pat. No. 4,075,464.

This invention relates to low frequency monitoring, and more particularly to digital circuitry that, through high frequency binary counting, measures and stores the precise 180° period of each low frequency cycle and, in the event of failure of the low frequency source, generates a pulse each time a 180° period would have normally occurred.

The circuitry of the invention provides a means for generating or adjusting a new A.C. frequency to obtain the precise period of a previously applied frequency that has been lost, such as through power failure, line breakdown, or the like.

BRIEF DESCRIPTION OF THE INVENTION

Briefly described, the circuitry of the invention internally generates high frequency pulse signals which are counted by a novel continually counting 10-bit binary counter to obtain a count for each 360° period of an applied A.C. power frequency. One-half of this value is stored in a buffer storage so that when the applied A.C. fails, the 180° count in the buffer is inverted and loaded into the counter so that the counter will count only the numbers stored in the buffer and will generate a 180° indicating output pulse at the end of each stored count.

A second storage buffer section in the circuit is displaced one bit from the previously described 180° buffer storage to store a count representing 90° of the applied A.C. frequency. The count in this 90° storage buffer is compared with the count building up in the normally operating counter and when the 90° point in each 360° cycle of the applied A.C. frequency is reached, an output pulse is generated that may be used for various timing devices or for controlling power switches for transient-free switching operations.

DESCRIPTION OF THE DRAWINGS

In the drawings which illustrate a preferred embodiment of the invention.

DETAILED DESCRIPTION OF THE PREFERRED EMBODIMENT

Figure 1:
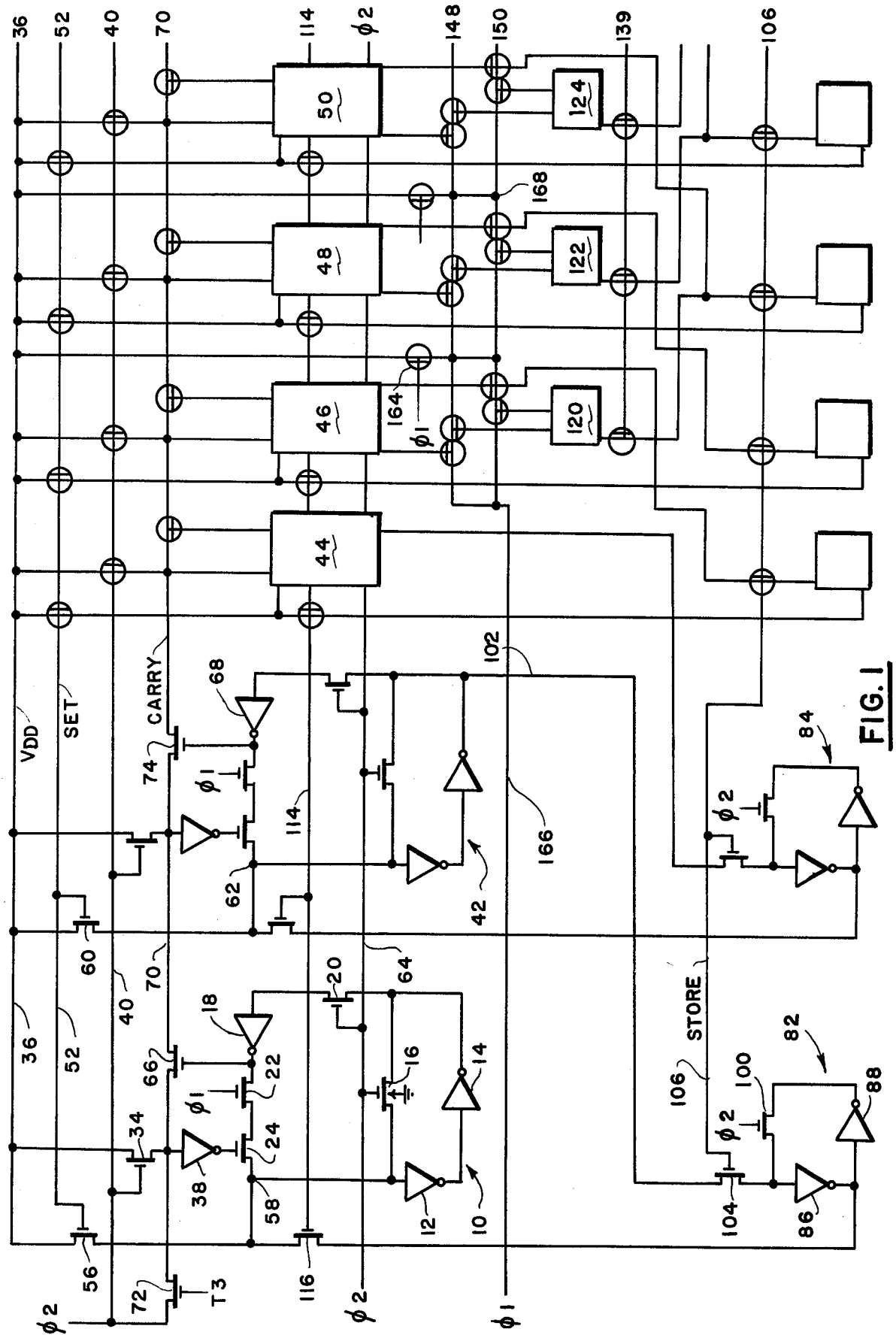
FIGS. 1 and 2 are detailed block diagrams illustrating the circuitry of the invention.

The preferred embodiment of the invention contemplates the use of a 10-bit binary counter comprised of ten identical cells, such as the least significant digit cell 10 illustrated in FIG. 1. Cell 10 contains a memory storage loop comprising an inverter 12 in series with a second identical inverter 14, the output of which is fed back to the input of inverter 12 through a FET switch 16. FET 16 and all other FETs throughout the entire system are preferably N-channel MOSFETs normally operating at cut-off and rendered conductive by a positive voltage on the gate. Thus, current flow through the circuit, including the inverters 12 and 14, only occurs when the gate element of FET 16 is at a positive value.

Cell 10 also includes a temporary storage section which includes the inverters 12 and 14, and a third inverter 18. Thus, the output of inverter 14 is coupled through a FET 20 to the input of inverter 18, the output of which is coupled through FET 22 and FET 24 to the input of the inverter 12. As previously mentioned, all FETs, such as FETs 16, 20, 22 and 24, are used exclusively as current gating devices rendered conductive by a positive voltage on the gate elements. In all instances, the positive enabling voltage signal is controlled by the system timing signals illustrated in FIG. 3.

Figure 3:
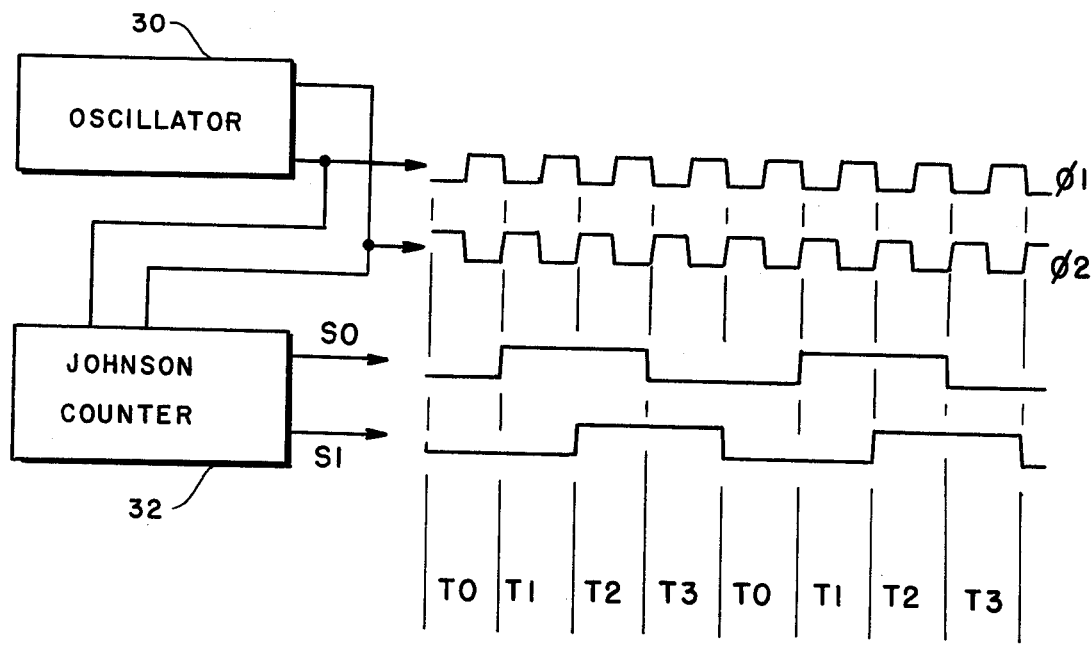
FIG. 3 is a diagram illustrating timing waveforms for the control of the circuitry in FIGS. 1 and 2.

As illustrated in FIG. 3, the circuitry includes an oscillator 30 which generates a constant frequency, two-phase output operating at a frequency several orders of magnitude greater than the frequency of the applied A.C. and preferably in the range of between 100 and 200 KHz. The two output terminals of oscillator 30 are coupled to control a four-bit Johnson counter 32 which produces the Johnson code output waveforms designated as S0 and S1. The timing that exists when both S1 and S0 are low is designated as state time T0. Time T1 occurs when S0 is high and S1 is low; T2 when both S1 and S0 are high; and T3 occurs when S0 is low and S1 is high. In the description of the preferred embodiment, reference will be made to the two phases $\phi 1$ and $\phi 2$, and the four state times, T0–T3.

Returning to the description of the circuitry of FIG. 1, gating elements 16 and 20 are rendered conductive by the occurrence of every positive-going $\phi 2$ signal so that during that period, a particular binary value appearing at the input of the inverter 12 will be recirculated through FET 16 and will also pass through the FET 20 to be inverted by inverter 18. When $\phi 2$ drops to its low state and $\phi 1$ goes from its low to high state, FET 22 will become conductive to pass the signal at the output of inverter 18 to the FET 24. The gate element of FET 24 is controlled by the state of $\phi 2$. FET 34 connects the positive D.C. drain conductor 36 to the input of an inverter 38, the output of which is coupled to the gate element of FET 24. The gate element of FET 34 is coupled to the $\phi 2$ conductor 40 so that upon the occurrence of $\phi 2$, the drain voltage is inverted by inverter 38 to put a negative voltage on the gate element of FET 24, thereby cutting off current between its source and drain elements. However, as $\phi 2$ drops to its low state, FET 34 becomes non-conductive and, unless prevented by a residual positive charge at its input, inverter 38 will begin to apply a positive voltage to the gate element of FET 24, thereby rendering it conductive so that the signal appearing at the output of inverter 18 may now pass to the input of inverter 12. It will be noted that the initial signal entering inverter 12 has passed through three inverters and is thereby changed to its opposite state.

As previously mentioned, cell 10 carries the least significant digit of the counter. Cell 42, illustrated to the right of cell 10 in FIG. 1, carries the next more significant digit and is identical in all respects with cell 10, as are the cells of next higher significance, such as cells 44, 46, 48 and 50 of FIG. 1.

OPERATION OF THE COUNTER

Figure 2:
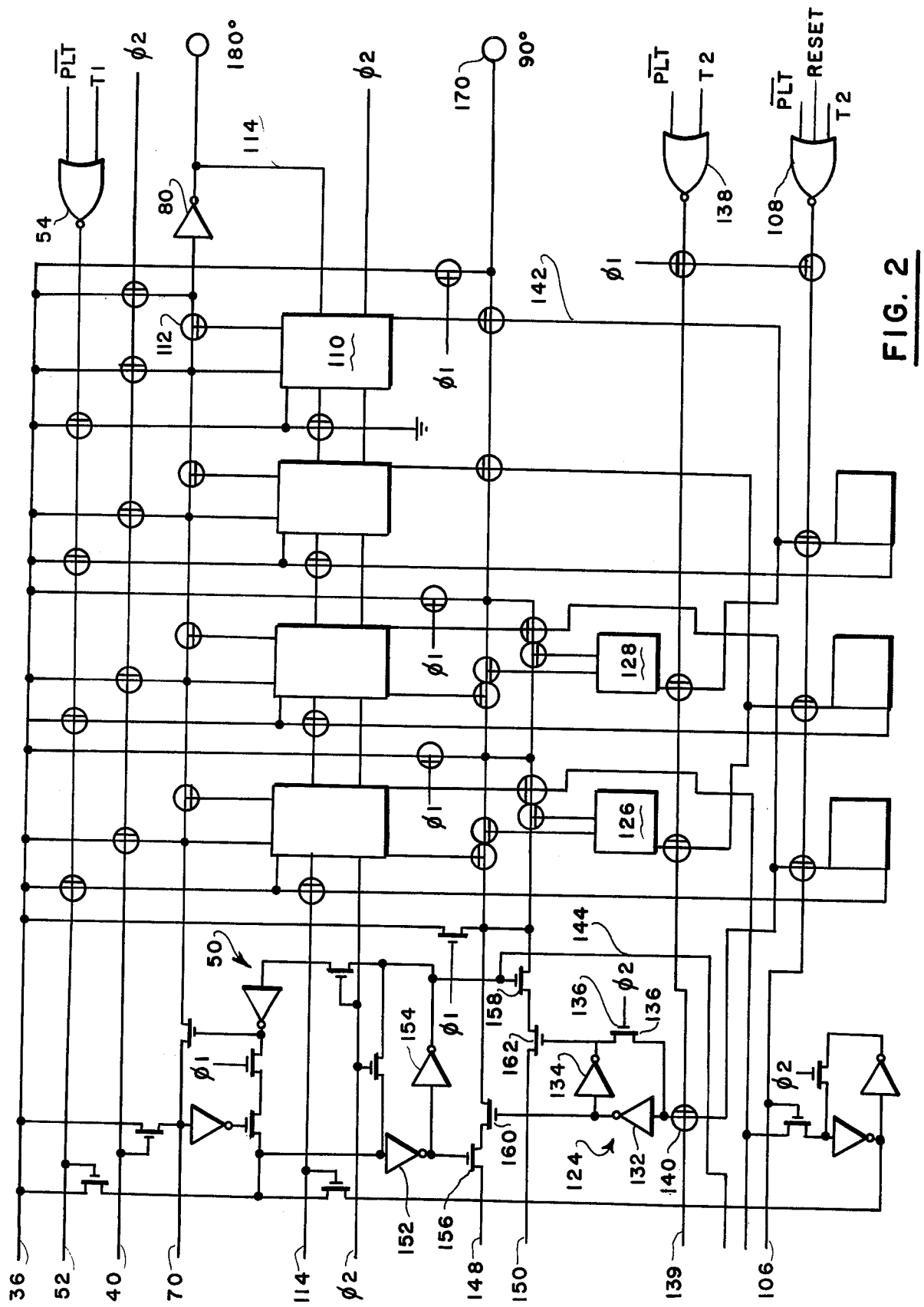

All cells of the counter are initially set by the occurrence of a pulse on the SET line 52. As illustrated in FIG. 2, SET line 52 is coupled to receive from a NOR-gate 54 a positive line transition pulse (PLT) occurring during the $\phi 1$ portion of state time T1. The positive line transition pulse PLT is generated by external circuitry that senses the positive going zero crossover point of the applied A.C. power signal and produces a very short pulse at the instant of that transition. It should be noted that the internal oscillator associated with the counter circuit is operating at a frequency of between 100 and 200 KHz and that the state times, such as time T1, will occur at least one time during each positive going transition of the applied A.C., thus assuring the appearance of an initiating pulse on the set line 52 during the application of a reset signal.

The positive initializing signal on SET line 52 will switch on FET 56 of FIG. 1 to couple the positive D.C. drain voltage of conductor 36 to the input node 58 in the cell 10. Similarly, the FET 60 is likewise rendered conductive to apply the positive voltage to the input node 62 of the next more significant digit cell 42. In a like manner, all other cells of the counter, such as cells 44, 46, 48 and 50 of FIG. 1, as well as those in FIG. 2, receive the positive input voltage at their input nodes.

The positive voltage appearing at node 58 of cell 10 is applied to the inverter 12 and the inverter 14 and, upon occurrence of the next positive-going signal on the $\phi 2$ conductor 64, the positive signal is permitted to circulate through FET 16 and is also passed through FET 20 to inverter 18, which inverts the value so that a binary "0" appears at its output. This "0" is applied to the FET 66, the function of which will be subsequently explained. All cells in the counter are simultaneously initialized in the same manner, so that upon the appearance of the first $\phi 2$ pulse, the initializing pulse will be applied to their output inverter to produce a "0" output in each cell of the counter.

Referring again to cell 10 of FIG. 1, the initializing pulse having been admitted to inverters 12 and 14 during $\phi 1$ of time T1 is now, during $\phi 2$, circulated through FET 16 and is passed through FET 20, the inverter 18 which produces a "0" output that is applied to the FET 22, and also to the gate of FET 66 to render FET 66 non-conductive. While $\phi 2$ is high, the FET 34 interconnects the positive D.C. drain conductor 36 with the input of inverter 38, the output of which is low to render FET 24 non-conductive. It will be noted also that the input terminal to inverter 38 is coupled to a conductor 70 which is designated the CARRY conductor.

CARRY conductor 70 is connected through FET 72 to the $\phi 2$ conductor 40 and FET 72 is enabled during the state time T3 so that when $\phi 2$ goes to its low value, it operates as a current sink to discharge the elements coupled to the CARRY line 70. It is to be noted that if FET 66 is rendered non-conductive by a "0" output from inverter 18, the occurrence of state time T3 will only permit discharge of those elements up to the FET 66. If, on the other hand, FET 66 is made conductive by the occurrence of a "1" output of inverter 18, then conduction of the FET 72 during state time T3 will discharge all elements along the CARRY line 70 up to the first gate that is non-conductive, such as FET 74.

An initiating pulse occurring during $\phi 1$ in state time T1 of FIG. 3, introduced into the input node 58 of cell 10, will be translated as a "0" at the output of inverter 18 upon the occurrence of the next $\phi 2$ signal which occurs in time T2. As indicated above, the "0" signal applied to the gate element of FET 66 renders it non-conductive. During the $\phi 2$ period, FET 34 conducts to apply the positive D.C. voltage of conductor 36 to charge the CARRY line 70 between FET 66 and FET 72. This positive voltage is inverted by inverter 38 to render FET 24 non-conductive.

During the second half of state time T1, $\phi 2$ goes to its low state and $\phi 1$ becomes high to render FET 22 conductive, all charges applied to the elements associated with line 70 during the previous $\phi 2$ period will remain on line 70 so that inverter 38 will continue to apply a disabling signal to the gate element of FET 24. Thus, the "0" output of inverter 18 remains during time T2.

The next time period of $\phi 2$ of state time T3. During this phase, FETs 16 and 20 conduct, inverter 18 continues to output a "0", FET 34 conducts to apply the positive voltage of conductor 36 to the CARRY conductor 70, and FET 72 becomes enabled and in condition to discharge line 70 whenever $\phi 2$ drops to its low state and can become a current sink for the charged elements associated with line 70. Therefore, when $\phi 2$ goes low, all charges on line 70 become dissipated and inverter 38 now applies an enabling positive signal to the gate element of FET 24.

While $\phi 2$ of state time T3 is dropping the inhibiting output of inverter 38 begins to rise above zero, thereby enabling FET 24. When $\phi 1$ starts to rise to enable FET 22, the short period between the dropping $\phi 2$ and the rising $\phi 1$ provides a current path from the output of inverter 18 to the input node 58 of the cell 10. Nothing more happens during $\phi 1$ of state time T3 except that FET 72 remains enabled to carry any remaining charges from the elements associated with line 70 to the current sink provided by the low value of $\phi 2$.

During the next period, $\phi 2$ of state time T0 the "0" previously applied to node 58 and transmitted by inverters 12 and 14, is circulated and inverted by inverter 18 to a "1" output which is applied to the gating element to render FET 66 conductive. FET 72 is now disabled and FET 34 now recharges the CARRY line 70 between FET 72 and FET 74 of cell 42. This condition remains until the next occurrence of state time T3 at which point FET 72 discharges the entire CARRY line 70 up to FET 74, thereby permitting the "1" output of inverter 18 of FIG. 1, and the "0" output of inverter 68 of cell 42 to enter into their respective input nodes 58 and 62, whereupon they are re-circulated during the next occurrence of $\phi 2$ into their alternate states at the outputs of their respective inverters.

All cells in the counter operate in the same manner. Since the section of CARRY line 70 associated with the cell 10 is discharged during every state period T3, the cell 10 will change its state after each occurrence of time T3. Cell 42, on the other hand, cannot change its state until after cell 10 produces a "1" output to open FET 66, thereby providing for the discharge of CARRY line 70 and the charged elements associated with cell 42. Similarly, the next higher order cell 44 will remain with a "0" output until both cells 10 and 42 produce a "1" output to open their FETs 66 and 74 to discharge the CARRY line 70 associated with cell 44. Thus, any one of the high order cells up through the most significant digit cell of the counter cannot change until the CARRY line 70 has been discharged up to that particular cell by the occurrence of "1" output signals in all lower order cells. In the above described manner, all cells of the counter continue to count as described until the occurrence of a positive line transition pulse (PLT) occurring during $\phi 1$ in state time T1, at which point the NOR-gate 54 (FIG. 2) will apply a new initiating pulse to the SET line 52 to reset all cells of the counter to "0". The count in the cells at the instant before reset represents one full period of the applied A.C. power signal.

STORAGE OF FREQUENCY COUNT

The total count representing one-half the A.C. period may be stored at the correct time in the storage buffer cells, such as cells 82 and 84 at the bottom of FIGS. 1 and 2. Each of the nine cells, such as cell 82, comprises first and second series inverters 86 and 88 with the output of inverter 88 connected through FET 100 to the input of inverter 86. The gate element of FET 100 is connected to a $\phi2$ line so that the data bit stored in the cell may circulate during any $\phi2$ period. As shown in FIGS. 1 and 2, each of the storage buffer cells receives an input from the counter cell of next higher order. For example, the data bit circulating through counter cell 42 of FIG. 1 passes its data through conductor 102 and FET 104 to the input node of the buffer cell 82. Thus, when a positive storage signal is transmitted through the STORE conductor 106, the data in all counter cells, except the least significant digit cell 10, is stored in a buffer cell while the counter continues to increment. As illustrated in FIG. 2, a positive STORE signal may be applied to conductor 106 by the application of an inverted PLT signal to NOR gate 108 along with an inverted reset signal during $\phi1$ of state time T2. Thus, the count appearing in the counter may be transferred upon application of a reset signal at the instant the counter has completed the count for one full A.C. period of the applied power frequency.

It will be noted that in the preferred embodiment illustrated in FIGS. 1 and 2, there are ten counter cells, such as cells 10 and 42, while there are only nine buffer cells, such as cells 82 and 84. Since each buffer cell stores the number appearing in the next higher order storage cell, the number stored in the buffer section is numerically equal to one-half of the number counted by the counter. Thus, while the counter counts and resets after each 360° period of the applied A.C., the count stored in the buffer is half of that count or the count representing a 180° half-period of the applied A.C. signal. When the reset input to NOR gate 108 is removed, the last stored value becomes the reference number henceforward.

In the event of failure of the A.C. signal, there will be no positive line transition pulse (PLT) applied to the NOR gate 54 of FIG. 2 and therefore no signal applied to the SET line 52 to reset all of the counter cells. In this event, the counters will continue to count until all of the cells, including the most significant digit cell 110 of FIG. 2, produces a "1" output to enable its CARRY propagate FET 112, indicated in the drawing in a simplified form. Therefore, the next occurrence of the state time T3 and when $\phi2$ drops to its low level, the CARRY line 70 will discharge to produce an output pulse from inverter 80. This pulse is carried by conductor 114 through each of the ten cells of the counter to enable FET switches, such as the FET 116 in cell 10 of FIG. 1. When all these FET switches, such as FET 116, are enabled, the inversions of the numbers stored in the buffer cells are loaded into their adjacent counter cells. Thus, the value stored in buffer cell 82 of FIG. 1 is inverted by the inverter 86 and the conductor connected to the junction between inverters 86 and 88 carries the inverted number through the FET switch 116 to the input node 58 of the counter cell 10.

The counter, now reloaded with an inverted count representing 180° of an applied A.C. signal, continues to be incremented in the usual manner. However, since the 180° count has been inverted, the counter now is effectively starting with a number representing a 180° count and subtracting to a "0" count. In actuality, however, the applied inverted number forces the counter to start at a relatively high value and continue incrementing its count until each cell of the counter outputs a "1", whereupon the next discharge of the CARRY line 70 will produce an output signal from the inverter 80. This output signal may be used for external synchronizing purposes and also continues to be fed back into the load conductor 114 to recycle the counter, which now produces output signals at each 180° half-period of the applied A.C. This continues until the A.C. signal has been applied and a positive line transition pulse (PLT) is applied to the input NOR-gate 54 of FIG. 2.

GENERATION OF 90° PULSES

As mentioned earlier, the circuitry of the invention produces output pulses at the 90° point of each 360° period of the A.C. input signal. This is accomplished by the use of five buffer storage cells 120, 122, 124, 126 and 128 aligned near the center of the drawings of FIG. 1 and FIG. 2. Each of the five cells 120–128 are identical and, as illustrated in cell 124, which is shown in detail in FIG. 2, comprises an inverter 132, the output of which is coupled to a second inverter 134, which is again coupled through FET 136 back into the input of the inverter 132.

All buffer cells 120–128 are loaded during a positive signal from the output of a NOR gate 138, which receives the inverted positive line transition pulse (PLT) and, during the $\phi1$ portion of state time T2, transmits a pulse to the input FETs, such as FET 140, so that the count appearing in their respective counter cells may be loaded into the 90° storage buffers. It should be noted that NOR gate 138 is independent of reset. Therefore the 90° count stored will be updated at each 360° period. Further, the 90° count will track any frequency drift of the oscillator.

It will be noted that each of the 90° storage buffers 120–128 is displaced two bits lower than the counter cell that supplies the load data. For example, it will be seen that the most significant digit counter cell 110 of FIG. 2 produces an output upon conductor 142 that is applied to the 90° buffer cell 128 located two positions to the left in the drawing, or two binary bits of lower significance. Similarly, the output of counter cell 50 of FIG. 2 passes its stored data through conductor 144 to the cell 120 in FIG. 1. Since any binary number can be divided by four by merely displacing the number by the amount of two bits of lower significance, the numbers stored in the buffer cells 120–128 will represent one-quarter of the total count of an A.C. period, or 90°.

The 90° count stored in the buffer cells 120–128 must be compared with the continually incrementing count in the counter cells so that, when each time the counter reaches a 90° point during its continually incrementing count up to its 360° reset point, an output pulse will be generated that may be used as desired for any circuit application, such as transient-free switching.

Comparison between the 90° storage buffer cells 120–128 and the counter is made by a comparison circuit comprising conductors 148 and 150 illustrated in FIGS. 1 and 2 between the counter cells and the 90° storage buffer cells. As best illustrated in FIG. 2, the number contained in counter cell 50 which, during $\phi2$, circulates through inverters 152 and 154, is inverted by inverter 152 to control conduction through FET 156 in the line 148. Similarly, the true value of the number circulating through counter cell 50 is taken from inverter 154 to control conduction of FET 158 in the conductor 150. In a like manner, the inverted value of the numbers stored in the buffer cell 124 is coupled from the inverter 132 to control conduction through the FET 160 in conductor 148 and the true value of the number in cell 124 controls conduction of the FET 162 in line 150.

As illustrated in FIG. 1, conductors 148 and 150 are connected together and to a $\phi 1$ signal which, when it drops from its high state to its low state, provides a current discharge path to discharge all elements associated with conductors 148 and 150 up to a point where further discharge may be blocked by a non-conductive gate.

It will be noted that conductors 148 and 150 are connected together between adjacent cells. For example, these conductors are intercoupled between the FETs controlled by counter cell 46 and buffer cell 120 and the FETs controlled by counter cell 48 and buffer cell 122. The interconnected conductors 148 and 150 are connected through FET 164 to the positive D.C. drain conductor 36. Upon the occurrence of each $\phi 1$ signal, a positive charging voltage is applied by FET 164 and all similarly connected FETs to the sections of conductors 148 and 150 lying between adjacent cells. At the end of the $\phi 1$ signal, this charge remains on these sections unless there is a current path from the charged section through conductors 148 and 150 to conductor 166 and to discharge in the sink provided by a low $\phi 1$. This can only occur when the number stored in the 90° buffer cell corresponds with the count in the counter cell. For example, referring to FIG. 1, the occurrence of a $\phi 1$ signal will render the section charging FET 164 conductive to apply positive charge to the conductors 148 and 150. At the end of the positive $\phi 1$ signal and when it goes to its low state, that portion of conductors 148 and 150 will discharge if there is a conductive path through the FETs controlled by cells 46 and 120. Similarly, signal correspondence in cells 48 and 122 will permit discharge of conductors 148 and 150 up to the point 168. It is clear, therefore, that when the count in the counter cells corresponds with the numbers stored in the buffer cells 120-128, there will be a complete discharge path that will generate an output pulse at terminal 170 of FIG. 2 upon occurrence of the 90° point in each A.C. signal.

Having thus described my invention, what is claimed is:

1. A.C. back-up frequency synthesizer circuitry for generating signals precisely indicative of the half-period of an applied A.C. frequency after removal of said frequency, said synthesizer circuitry comprising:

high frequency generating means for producing a continuous train of pulses at a substantially constant frequency several orders of magnitude greater than the frequency of the applied A.C.;

counting means coupled to said high frequency generating means and reset by the occurrence of a positive line transition denoting the beginning of a cycle of said applied A.C. for counting the number of pulses between said occurrences;

count storage means coupled to said counting means for storing the count, excluding the lease significant digit thereof, reached by said counting means between said occurrences of positive line transitions; and loading means responsive to the absence of said positive line transition and the subsequent count overflow of said counting means for loading the inverted value in said count storage means into said counter including the least significant digit portion thereof, whereby said counter will produce overflow signals upon counting a number of pulses representing each half-period of the frequency of the previously applied A.C.

2. The circuitry claimed in claim 1 wherein said counting means includes a plurality of identical first resettable binary storage cells each having an input node and each having signal inverting means having an output controlling the conduction through an adjacent portion of a conductor extending between a switchable current sink and through all cells of said counting means to the overflow output terminal of said counting means.

3. The circuitry claimed in claim 2 wherein said counting means includes means controlled by said train of high frequency pulses for switching said switchable current sink through all portions of said conductor between said switchable current sink and a conductor portion where further conduction is blocked by the state of the output of a first resettable binary cell signal inverting means, said counting circuitry further including incrementing means controlled by said high frequency pulse train for reversing the output state of each first binary cell along said conductor between said switchable sink and the first point in said conductor where further conduction is blocked by a conduction inhibiting output state of said first binary cell inverting means.

4. The circuitry claimed in claim 3 wherein each of said first binary cell inverting means is coupled to the gate element of an FET switch rendered conductive by a binary "1" output state of said inverting means.

5. The frequency synthesizer circuitry claimed in claim 2 wherein said count storage means comprises second binary storage cells, each cell including first and second inverters, the outputs of said first and second inverter coupled to the input of the second and first inverter, respectively, each of said second storage cells receiving an input of the signal inverting means in one of said first binary storage cells in said counting means, and, upon failure of the applied A.C. frequency, said second storage cell loading its stored signal from the output of said first inverter to the input node of the next lower order cell of said first binary storage cells in said counting means.

6. The circuitry claimed in claim 5 wherein said input signals received by said second binary storage cells from said first resettable binary storage cells in said counting means are transmitted when said counting means has completed a count representing a 360° period of the applied A.C. frequency.

7. The circuitry claimed in claim 6 wherein said second storage cells load their stored data to the input node of the next lower order cells in said counter means upon receiving a loading signal generated in response to a failure of said applied A.C. frequency.

8. The circuitry claimed in claim 6 wherein said loading signal is generated by a count overflow of said counting means.

9. The circuitry claimed in claim 2 further including 90° signal circuitry for generating an output signal at the 90° point of each full period of the applied A.C. frequency.

10. The circuitry of claim 9 wherein said 90° signal circuitry includes a plurality of third storage cells comprising first and second inverters connected in a series ring configuration, each of said third storage cells coupled to receive and store the output from one of said first resettable binary storage cells in said counting means, each of said third storage cells including comparison means for comparing its stored number with the count number stored at any instant in the first binary storage cell located at two bits of lower significance.

11. The circuitry claimed in claim 10 wherein said comparison means includes first and second conductors, said first conductor containing first and second series gating elements controlled by the outputs of said first resettable binary storage cells and said third storage cells respectively, said second conductor containing third and fourth series gating elements controlled by the inverted outputs of said first resettable binary storage cells and said third cells, respectively, said first and second conductors being interconnected at the ends to produce an output signal upon signal correspondence between the count stored in said third storage cells with the count reached by said first binary storage cells in said counting means.

* * * * *